(12) United States Patent
Dim et al.

(10) Patent No.: US 8,919,528 B2
(45) Date of Patent: Dec. 30, 2014

(54) NOZZLED DEVICE TO ALIGN A SUBSTRATE ON A SURFACE

(75) Inventors: Yuval Dim, Moshav Haniel (IL); Nir Passi, Zur Moshe (IL); Yaron Dekel, Gan Yeoshaya (IL)

(73) Assignee: Hewlett-Packard Industrial Printing Ltd., Netanya (IL)

( * ) Notice: Subject to any disclaimer, the term of this patent is extended or adjusted under 35 U.S.C. 154(b) by 145 days.

(21) Appl. No.: 13/548,525

(22) Filed: Jul. 13, 2012

(65) Prior Publication Data
US 2014/0014471 A1   Jan. 16, 2014

(51) Int. Cl.
*H01L 21/68* (2006.01)

(52) U.S. Cl.
CPC ..................... *H01L 21/68* (2013.01)
USPC ........................ 198/345.1; 198/493

(58) Field of Classification Search
CPC ............. B65G 47/24; H05K 13/0413; H01L 21/67784; H01L 21/67092; H01L 21/68
USPC ........ 198/493, 345.1, 688.1; 414/936; 271/97
See application file for complete search history.

(56) References Cited

U.S. PATENT DOCUMENTS

| 5,419,256 A | 5/1995 | Pollich |
| 6,980,766 B2 | 12/2005 | Ito |
| 2001/0005640 A1* | 6/2001 | Ushiki et al. ............ 438/800 |
| 2005/0061852 A1* | 3/2005 | Behler .................. 228/102 |
| 2007/0215039 A1 | 9/2007 | Edwards et al. |
| 2010/0254788 A1* | 10/2010 | Dromard et al. ....... 414/222.02 |
| 2013/0215205 A1* | 8/2013 | Shapira et al. ............ 347/104 |

FOREIGN PATENT DOCUMENTS

| DE | 4445041 A1 | 6/1996 |
| WO | WO 2012059916 A2 | 5/2012 |
| WO | WO2012059916 A2 * | 5/2012 |

OTHER PUBLICATIONS

Tharayil et al.; "3DOF closed loop sheet alignment on non-holonomic printer differential drive registration device using input-state linearization"; 2010 American Control Conference Marriott Waterfront, Baltimore, MD, USA, Jun. 30-Jul. 2, 2010, pp. 3500-3505.

* cited by examiner

*Primary Examiner* — Mark A Deuble

(57) ABSTRACT

A method system and device, to align a substrate on a surface, the device including a first intake and a second intake where the first intake is configured to accept a first fluid and the second intake is configured to accept a second fluid. The first fluid is channeled into the device to vertically move the device a distance, and the second fluid calibrated and channeled into the nozzle, the nozzle having a focusing outlet, and where the fluids are configured to exert a force to facilitate the alignment of the substrate on the surface.

20 Claims, 9 Drawing Sheets

NOZZLED DEVICE TO ALIGN A SUBSTRATE ON A SURFACE

BACKGROUND

XY tables may be used as a positioning table in semiconductor assembling equipment, machine tools, measurement equipment, printing and other uses. In some instances XY tables may be substrate loading tables. Substrate loading tables may be used in many industries including printing and silicon wafer printing. Substrate loading tables may use rollers. Rollers typically provide for low friction interaction with the substrate to be acted upon and help automate a process by moving, positioning and stopping the substrate as necessary along a production line. The rollers may be designed to accommodate many different types of substrates, typically the system may be designed for a substrate with a particular set of properties. Properties of a substrate may include varying in width, length, thickness, area, density and chemical composition.

Flat bed inkjet printers print on both rigid and flexible substrates. These printers may have a large bed onto which the substrate may be placed. The substrate may be placed in a certain orientation, typically matching bed/print-head movement directions. Because of differences in properties of the flexible and rigid substrates, two different automatic loading systems may be used.

BRIEF DESCRIPTION OF THE DRAWINGS

Examples are described in the following detailed description and illustrated in the accompanying drawings in which.

Figure 1:
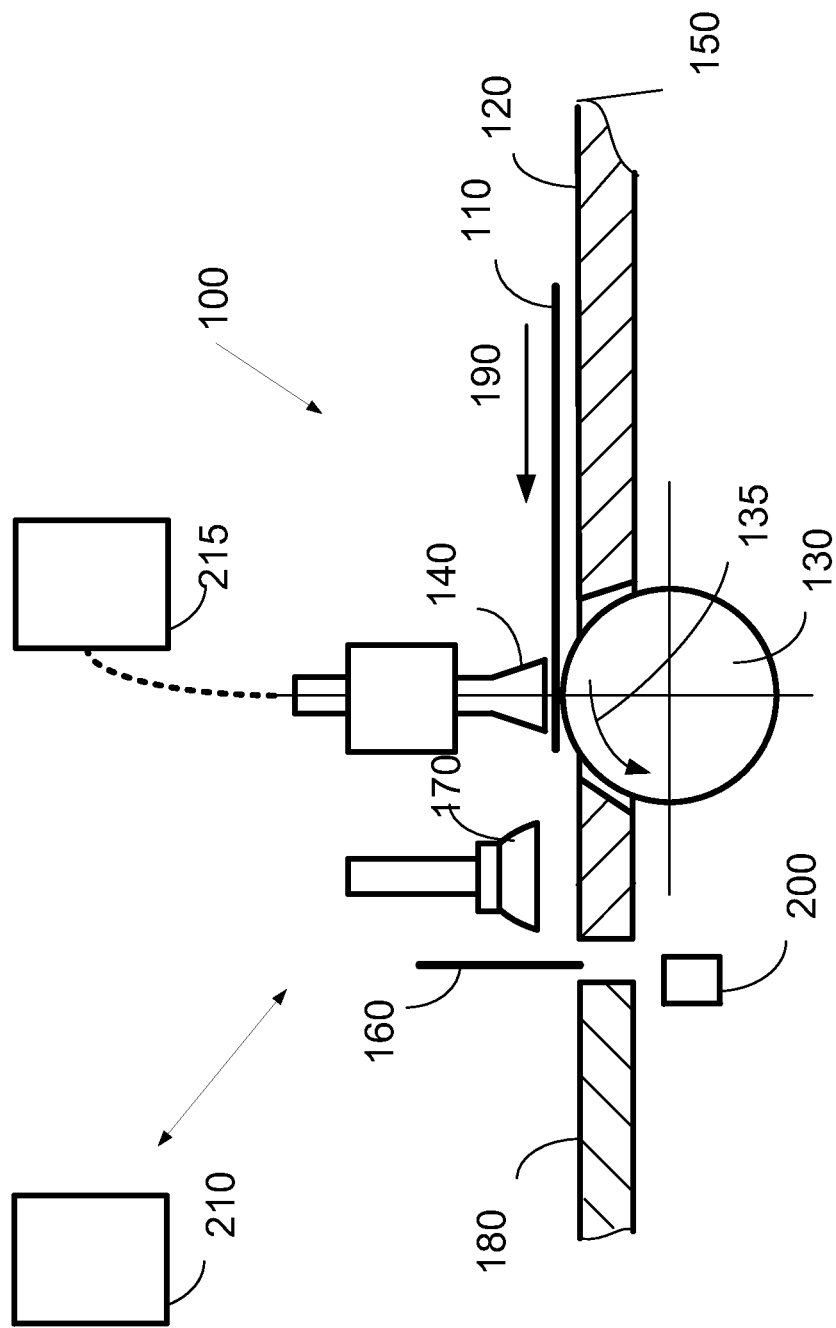
FIG. 1 is a schematic illustration of an automatic loading system according to an example.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the methods and apparatus. However, it will be understood by those skilled in the art that the present methods and apparatus may be practiced without these specific details. In other instances, well-known methods, procedures, and components have not been described in detail so as not to obscure the present methods and apparatus.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

FIG. 1 is a schematic illustration of an automatic loading system according to an example.

A loading system 100 may be configured to load one or a plurality of substrates 110 automatically. Substrates 110 may come from a roll of substrates, wherein a manual and/or automatic cutting system cuts a section of substrate to be loaded onto loading system 100. In some examples, substrate 110 may come from a stack of substrates 110, or other sources of substrate 110.

Loading system 100 may be used with print systems, semiconductor construction, or other systems that move substrates 110 along a path.

Loading system 100 may be configured to handle rigid and flexible and other substrates 110. In some examples, loading system 100 may be configured to transition from one type of substrate 110 to a different type of substrate 110.

In some examples, loading system 100 includes a loading surface 120. Loading surface 120 may allow for the placement of substrate 110. A roller 130 may be a component of loading surface 120, coupled to loading surface 120 or configured to interact with loading surface 120. Roller 130 may be configured to roll in a specific direction, as depicted by arrow 135, and/or at a specific rate and/or speed. Roller 130 may be covered with a second material to increase friction.

One or a plurality of nozzles 140 may be placed above roller 130. In some examples the one or plurality of nozzles 140 may be placed above a long edge of roller 130. In some examples, the plurality of nozzles 140 placed above the long edge of roller 130 may form a line of rollers 130, the line parallel with an edge 150 of loading surface 120. Nozzle 140 may supply a pressurized or otherwise stored flow of a fluid, e.g., air, to substrate 110 as substrate 110 passes over roller 130.

A stopper 160 may provide a reference surface in loading system 100. Stopper 160 may be a static barrier. Stopper 160 may be a movable barrier. Stopper 160 may be made from a plastic or a metal or another material or a combination of materials. Stopper 160 may provide an edge for lining up substrate 110 for use in a printer or other mechanism. Stopper 160 may provide a surface for use in lining up substrate 110, or for aligning substrate 110 or for facilitating an alignment of substrate 110. Stopper 160 may facilitate the registering of substrate 110.

In some examples, one or a plurality of sensors 200 may be positioned near stopper 160 to determine and/or confirm alignment of substrate 110. Once substrate 110 has been aligned, one or a plurality of vacuum cups 170 may raise substrate 110 and place substrate 110 on a printer bed 180. In some examples, one or a plurality of vacuum cups 170 may raise substrate 110 and place substrate 110 on another surface, or in another location or manipulate substrate 110.

In some examples, surface 120 may include rollers, spherical balls or other means to facilitate the movement of substrate 110 along surface 120 toward printer bed 180. In some examples rollers, spherical balls or other means that facilitate the movement of substrate 110 may move substrate 110 in the direction indicated by arrow 190. In some examples rollers, spherical balls or other means may facilitate the movement of substrate 110 in a direction different or similar from arrow 190, to position, register, and/or align substrate 110.

Nozzle 140 may be configured to provide differing flows of a fluid, in some examples airflows, or air pressure, depending on the nature of substrate 110. In some examples, nozzle 140 may be able to provide a downward force of different magnitudes depending on substrate 110. In some examples, the amount of downward force provided by a fluid, e.g., air, from nozzle 140 for use with a specific substrate 110 may be determined experimentally, empirically, and/or by other means. In some examples nozzle 140 may be configured to provide optimized flow of a fluid for common substrates 110.

In some examples there may be a control unit 210. Control unit 210 may be configured to execute programs and algorithms, some of the programs and algorithms, as are known in the art, via an incorporated processor. Control unit 210 may be configured to be in communication with the rollers and spherical balls described above. Control unit 210 may be configured to be in communication with sensors 200. Control unit 210 may be configured to be in communication with nozzle 140 and fluid source 215. Control unit 210 may be configured to be in communication with stopper 160. Control unit 210 may be configured to be in communication with vacuum cups 170. Control unit 210 may be configured to be in communication with other components in system 100. Control unit 210 may be configured to be in communication with other components outside of system 100.

Figure 2:
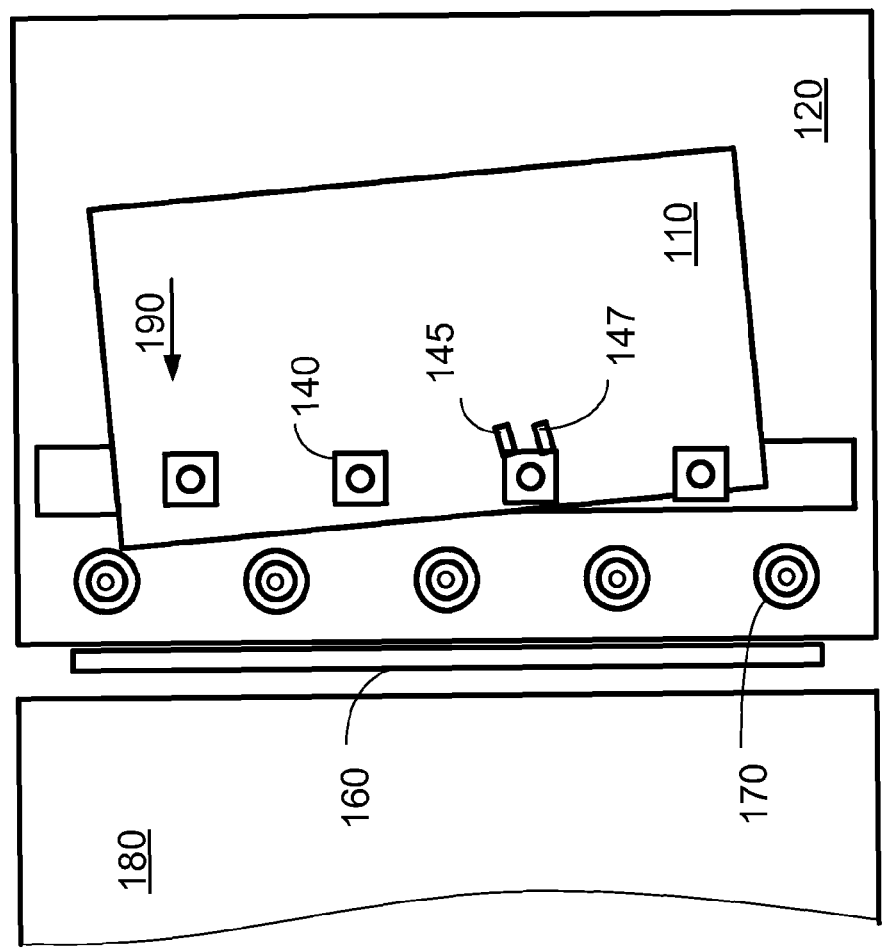
FIG. 2 is a top-down view of system 100, according to an example.

FIG. 2 is a top-down view of system 100, according to an example.

Figure 5:
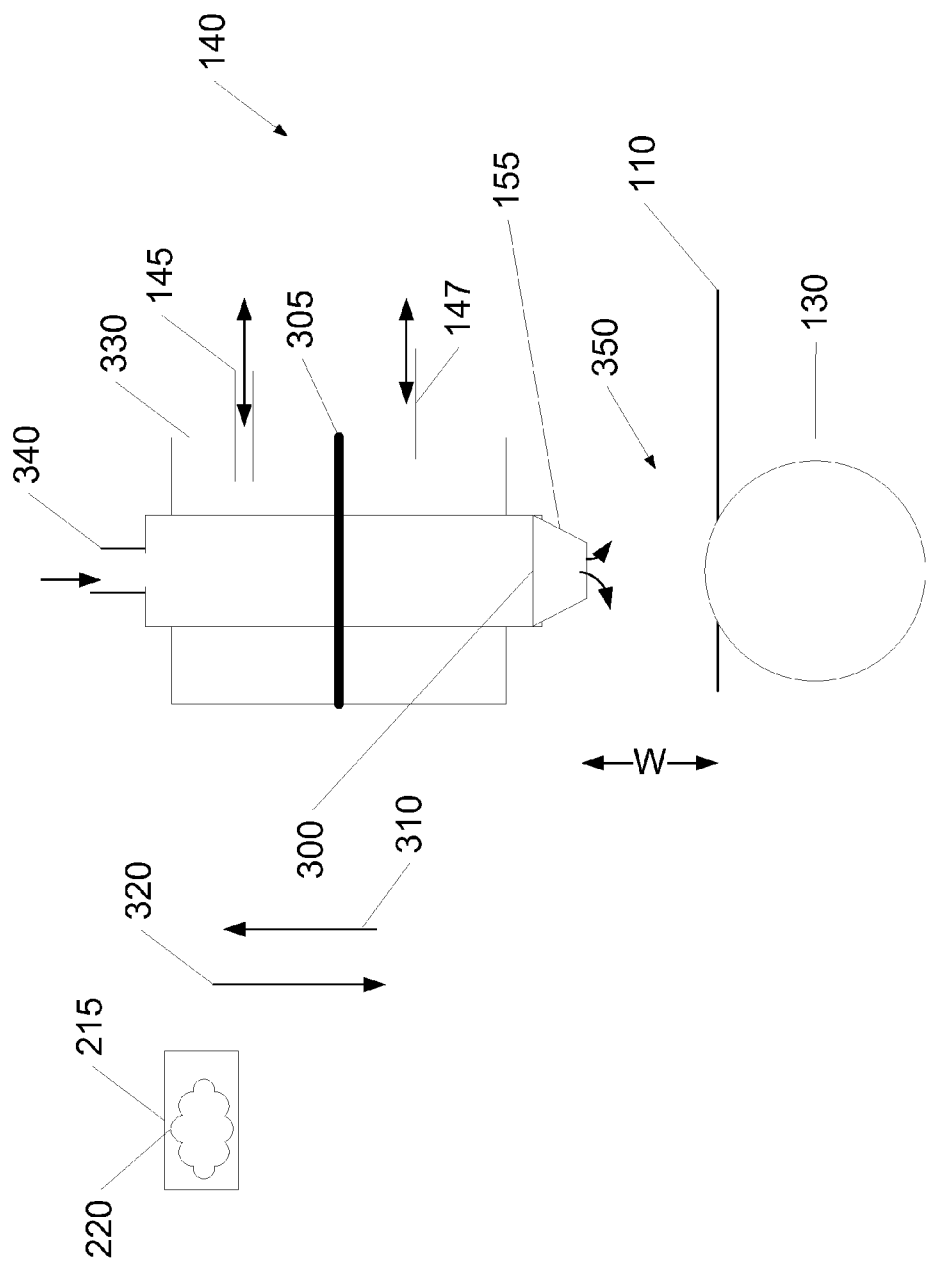
FIG. 5 is a schematic illustration of nozzle according to an example.

Substrate 110 may be placed in an arbitrary position on loading surface 120. In some examples, loading surface 120 may be a table. In some examples, loading surface 120 may be an XY table. Substrate 110 maybe displaced manually or via physically means, for example, via elements within loading surface 120, e.g., balls or rollers. In some examples, substrate 120 may be moved across loading surface 120 until it engages roller 130, described above. Roller 130 may be made of a metal, plastic or other material or a combination thereof. Substrate 110, once engaged with roller 130 may enter an area where there may be a gap between roller 130 and one or a plurality of nozzles 140. Nozzles 140 may be configured to provide a flow of a fluid, e.g., an airstream, as described below. The fluid may be accepted into nozzle 140 through a passage 145, e.g. an intake when fluid is being passed in and an exhaust when fluid is being passed out. There may be a second passage 147, e.g. an intake when fluid is being passed in and an exhaust when fluid is being passed out, as described below. In some examples the flow of fluid emitted by one or a plurality of nozzles 140 may be focused. Flow of fluid may be focused by focusing outlet 155, as depicted in FIG. 5. The flow of the fluids may be configured to reversibly couple or otherwise engage substrate 110 with roller 130. The flow of the fluids may be configured such that a force of the airstream and/or the downward force of nozzle 140 is sufficient to facilitate the movement, registration and/or alignment of substrate 110 with roller 130.

Figure 3:
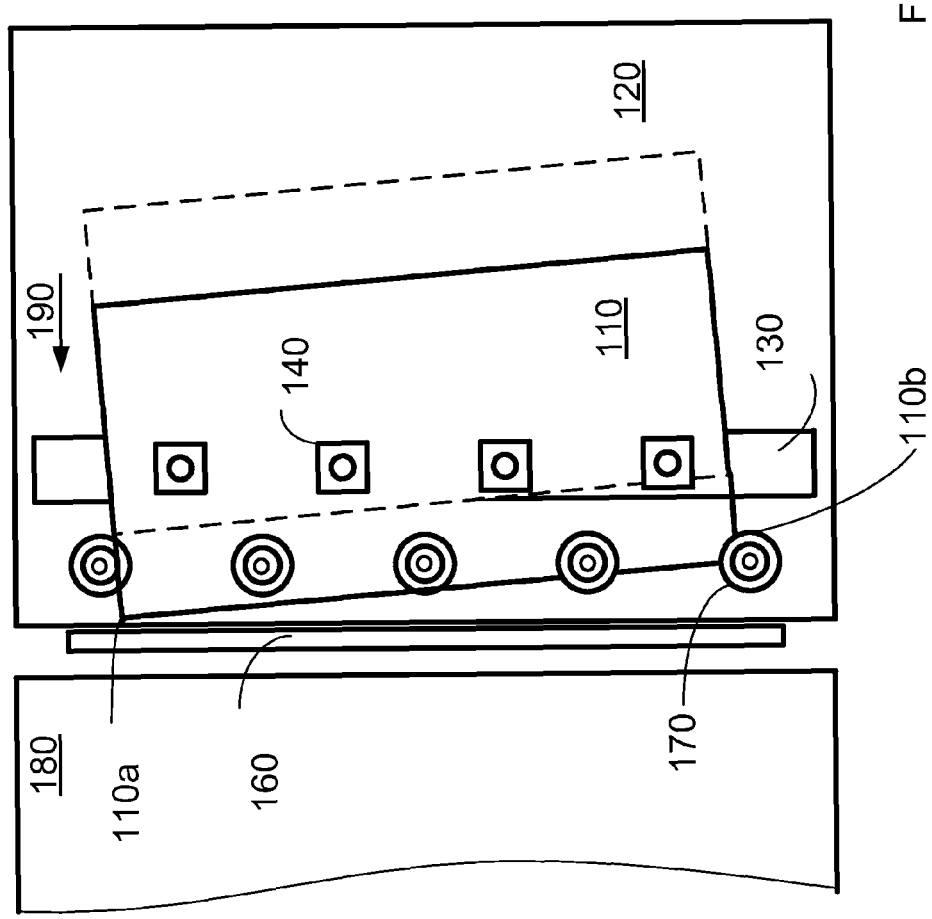
FIG. 3 is a schematic illustration of a portion of an alignment or registration of a substrate according to an example.

FIG. 3 is a schematic illustration of a portion of an alignment or registration of a substrate according to an example.

FIG. 3 presents an overhead view of system 100. In some examples, roller 130 may push substrate 110, or otherwise cause substrate 110 to move, until substrate 110 meets stopper 160. In an example depicted, a corner 110a of substrate 110 may be in contact with stopper 160 prior to another portion of substrate 110, while substrate 110 passes along loading surface toward printer bed 180, or toward another destination. Substrate 110 is illustrated as an element in FIG. 3 with a broken line perimeter. Substrate 110 is also illustrated as an element in FIG. 3 with a solid line perimeter to schematically illustrate the movement from an initial position, the broken line perimeter, to a second position, as depicted by the element in FIG. 3 with a solid line perimeter.

Figure 4:
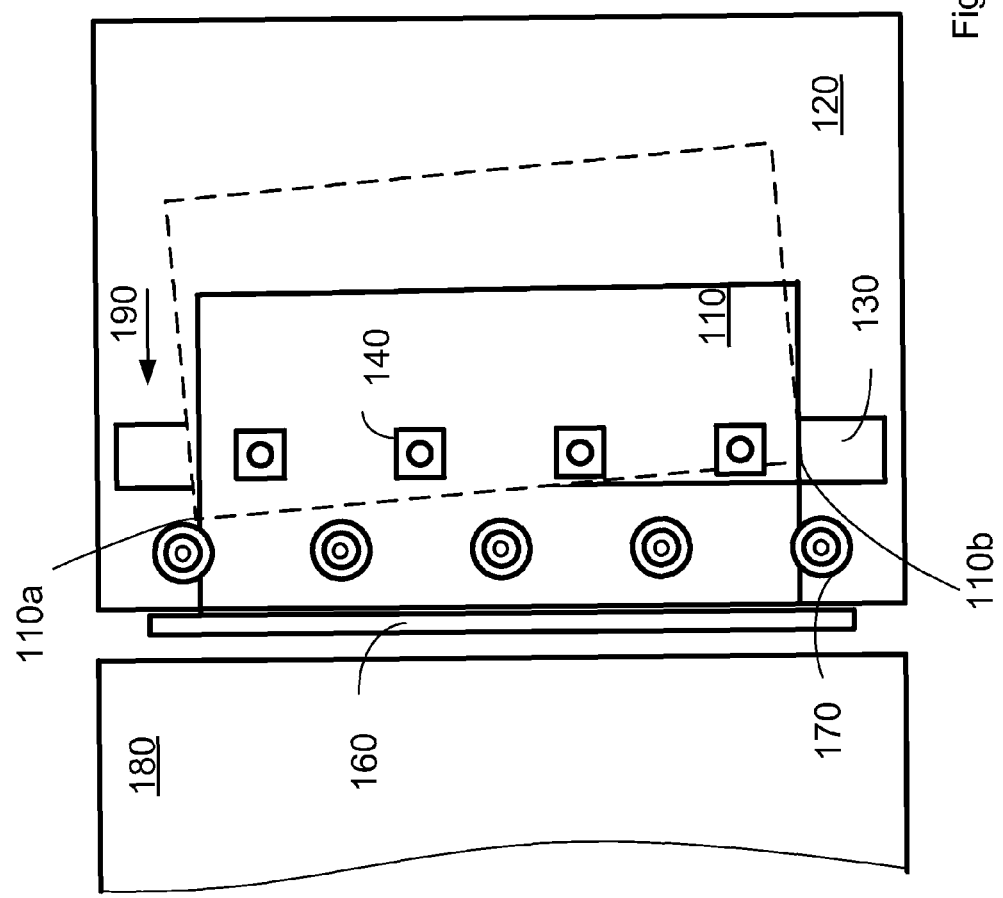
FIG. 4. is a schematic illustration of an alignment of a substrate according to an example.

FIG. 4. is a schematic illustration of an alignment and/or registration of a substrate according to an example. In some examples, roller 130 may push or otherwise cause substrate 110 to move, until substrate 110 meets stopper 160. In the example depicted, corner 110a of substrate 110 may be in contact with stopper 160 prior to another portion of substrate 110, while substrate 110 passes along loading surface toward printer bed 180 or another destination. In some examples, roller 130 may continue to rotate as substrate 110 moves in the direction of arrow 190. Corner 110a of substrate 110 may remain stationary against stopper 160 as a corner 110b continues to move in the direction of arrow 190.

In some examples, substrate 110 may align and/or register with stopper 160 with corners 110a and 110b adjacent or near stopper 160. Aligned and/or registered substrate 110 may be raised with suction supplied by vacuum cups 170, the suction may be sufficient to lift and move substrate 110 to printer bed 180, or to another location. In some examples the moved substrate 110 may be in an orientation, the orientation sufficient for a next stage is substrate processing. In some examples, substrate 110 may be registered and ready to continue to a destination.

FIG. 5 is a schematic illustration of nozzle 140. Nozzle 140 includes a piston 300, piston 300 configured to slide in directions 310 and 320 depicted by arrows respectively. Piston 300 may sit within a shaft or cylinder 330, and in some examples, slide up and down in directions 310 and 320 as a result of a fluid channeled into shaft or cylinder 330, the fluid may be pressurized air or another fluid. A fluid source 215 described above with reference to FIG. 1, e.g., a source of pressurized air, may, in response to a signal from control unit 210, cause a fluid, e.g., pressurized air, to flow through passage 145 and push down piston, in some examples through pushing on piston head 305. There may also be a passage 147 configured to exhaust air or other fluids in shaft or cylinder 330. The flow of the fluid may cause piston 300 to slide downward through shaft or cylinder 330 toward, in some instances, roller 130. In some examples, a cessation, or limitation of flow of fluid from fluid source 215 through intake 145 to shaft or cylinder 330 may cause piston 300 to move up, in the direction depicted by arrow 310. In some examples, directing flow of a fluid into passage 147 and allowing fluid to exhaust through passage 145 may allow piston 300 to move in the direction depicted by arrow 310.

Piston 300 may have a channel 340 for conducting a fluid, e.g., pressurized air or other propellants, channel 340 may be coupled directly or indirectly with a fluid source 215, e.g., a source of pressurized air.

A gap 350 between nozzle 140 and roller 130 may be of width W. Width W may allow for the passage of substrates 110 of different thickness and composition. Width W of gap 350 may be changed as per signals or other communication from control unit 210. In some examples, the movement of piston 300 in directions 310 and or 320 may change width W of gap 350.

When nozzle 140 is idle, e.g., it is not interacting with substrate 110, W may be larger than when nozzle 140 is not idle, e.g., it is interacting with substrate 110. In an idle state, gap 350 between nozzle 140 and roller 130 may be large enough to allow for the insertion of various forms of substrate with varying characteristics. When nozzle 140 is not idle, width w of gap 350 may be reduced by moving piston 300 down in direction of arrow 320. Fluid from focusing outlet 155 may push substrate 110 down toward roller 130. In some examples, a pressure that fluid 220 applies to the substrate through focusing outlet 155 may be equal to the force applied by piston 300 to maintain gap width W.

In some examples, when roller 130 engages substrate 110 or a portion thereof, width W may be reduced by air pressure that forces piston 300 down through shaft or cylinder 330 in direction 320. In some examples, there may be more than one flow of fluid 220 in nozzle 140.

Figure 6:
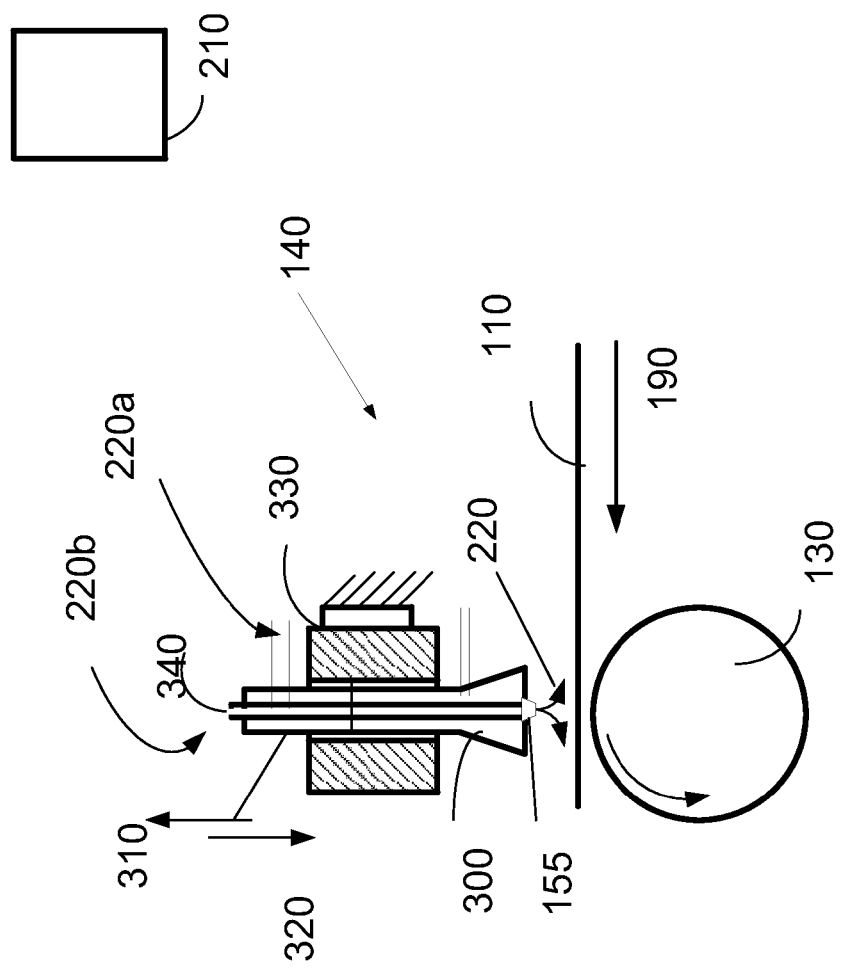
FIG. 6 is a schematic illustration of a nozzle engaging a substrate according to an example.

FIG. 6 is a schematic illustration of a nozzle engaging a substrate according to an example.

In some examples, a first fluid 220a, which may enter nozzle 140 through passage 145, may be configured to lower piston 300 and/or nozzle 140 within a predefined distance to substrate 110. A second fluid 220b, which may enter nozzle 140 through intake 340, may be configured to be expelled through nozzle 140 at substrate 110, when substrate 110 is coupled or otherwise interacting with roller 130. Flow of fluid 220a and fluid 220b may be controlled by control unit 210. In some examples, the pressure created by the force of piston 300 being pushed down through shaft or cylinder 330 toward roller 130 and/or substrate 110 may create sufficient force to maintain contact between substrate 110 and roller 130. Force of fluid being pushed down through piston 300 through focusing outlet 155 and out toward gap 350 may facilitate the flow of substrate 110 over roller 130 and or to facilitate the alignment and/or registration of substrate 110.

Roller 130, or a portion thereof, may engage substrate 110, or a portion thereof. In some examples, piston 300 in nozzle 140 moves in direction 320 in response to a flow of a fluid, e.g., air pressure that pushes piston 300 through shaft or cylinder 330. As nozzle 140 moves toward substrate 110 width W between nozzle 140 and substrate 110 gets smaller, reducing gap 350. A calibrated fluid flow, in some examples, optimized for a substrate 110, to nozzle 140 may be applied continuously to maintain gap 350 at a width W, wherein W is optimized to allow substrate 110 to interact with roller 130 such that substrate 110 moves in direction 190 across surface 120. In some examples, substrate 110 may interact with roller 130 such that substrate 110 moves in direction 190 across surface 120 in a manner desired by a user. A friction force and/or downward pressure may be created between nozzle 140 and substrate 110, in some examples, via flow of a fluid through channel 340 out focusing outlet 155 to facilitate a controlled movement of substrate 110 and to control an interaction between substrate 110 and roller 130.

In some examples fluid flow, e.g., air pressure may be directed through channel 340 in direction 320. The fluid flow may be directed through one or a plurality focusing outlets 155 in nozzle 140 at substrate 110. Typically, the flow of fluid may be optimized via experimentation, empirical methodologies or algorithms for distinct substrates 110, depending on characteristics of substrate 110, include thickness, rigidity, flexibility, composition, smoothness, and other characteristics. Fluid flow may be provided via a coupling with a fluid source 215. Fluid source for channel 340 may be the same or different from fluid source for moving piston 300.

Changes in the flow of fluid for either piston 300 through passages 145 and/or 147 and/or channel 340 may be controlled by control unit 210.

Figure 7:
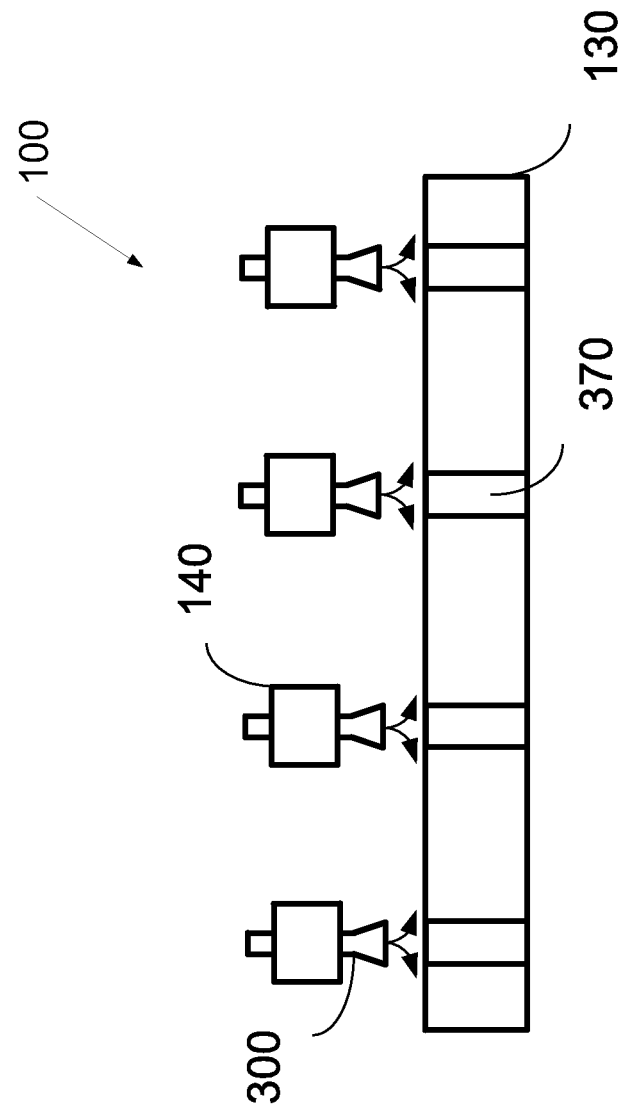
FIG. 7 is a schematic illustration of a plurality of nozzles 140, according to an example.

FIG. 7 is a schematic illustration of a plurality of nozzles 140, according to an example One or a plurality of nozzles 140 may be configured to be in system 100. In some examples, the air flow resulting from a flow of fluid funneled through channel 340 and/or passage 145 when passage 145 is an intake, may be decreased when strips 370 are applied to roller 130, the strips may have a higher friction coefficient than a surface of roller 130, the surface configured to come in contact with substrate 110, described above. Fluid flow may be set as function of substrate thickness, weight, size and other parameters allowing loading system 100 to load both flexible substrates 110 such as paper or plastic substrates and rigid substrates 110 such as carton, kappa and wood.

Figure 8:
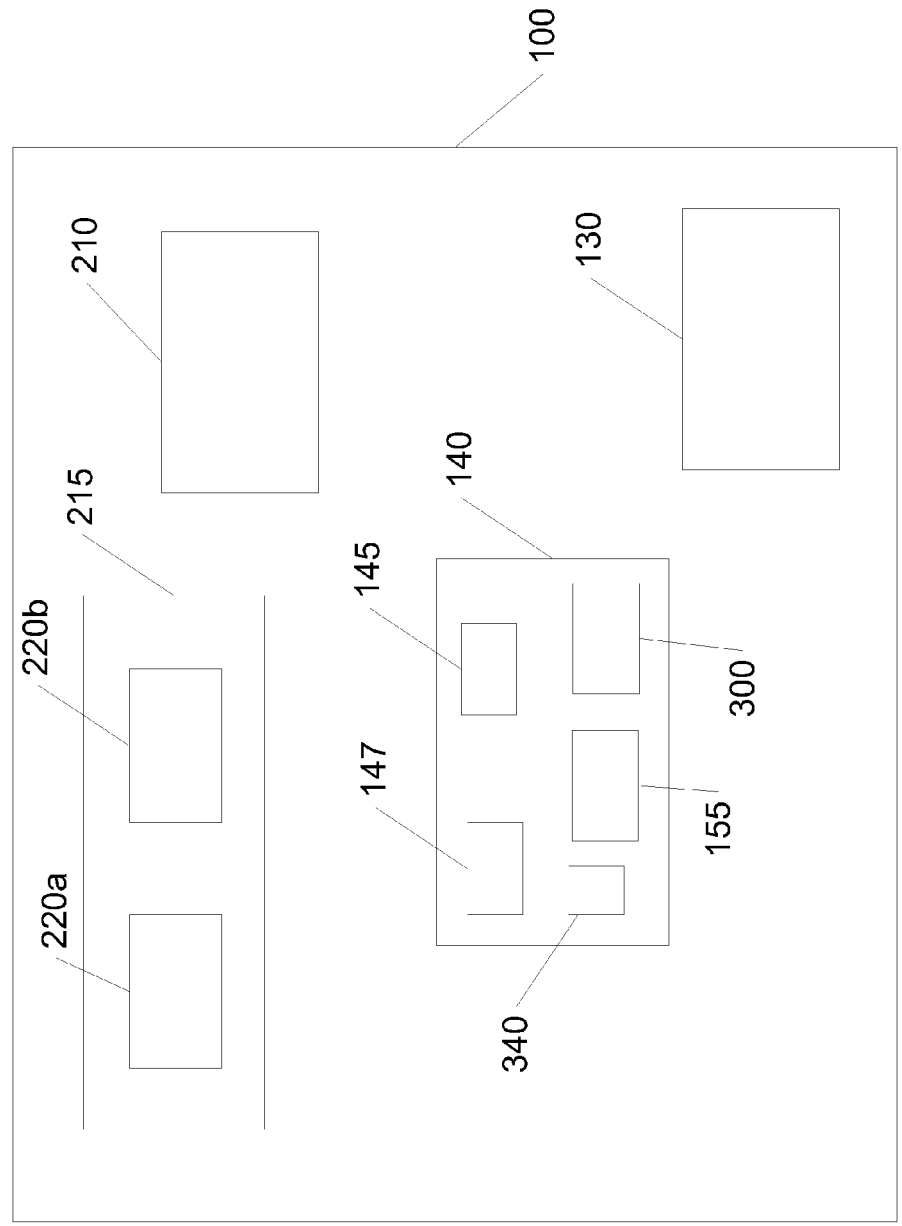
FIG. 8 is a schematic illustration of a system, according to an example.

FIG. 8 is a schematic illustration of a system according to an example

In some examples, a system 100 may be configured to align and/or register a substrate 110, described above, on a surface 120, described above, via a nozzled device, e.g., nozzle 140, described above.

The system may comprise a first passage 145, as described above, and a second passage 147 and an intake 340 as described above. A first intake may be passage 145 and passage 147; passages 145 and 147 may be configured to intake and/or exhaust a first fluid 220a from a fluid source 215. A second intake 340 may be configured to accept a second fluid 220b, the fluid exhausted through focusing outlet 155. In some examples, fluid 220b is received into intake 340 from fluid source 215. In some examples, fluid 220b is received into intake 340 from a different source. Flow of fluid 220a and 220b may be controlled by control unit 210.

First fluid 220a may be channeled into the nozzled device to vertically move the nozzled device a distance. In some examples, a component of the nozzled device, e.g., piston 300 described above or nozzle 140 may move a distance. In some examples, the distance is across gap 350, gap 350 described above. The movement of nozzled device, or a component thereof across gap 350 may shorten width W.

Second fluid 220b may be calibrated and channeled into nozzle 140. Nozzle 4 140 may have a focusing outlet 155, as described above. Second fluid 220b may be expelled from nozzle 140 such that the coupling, and or interaction of substrate 110 on roller 130 is changed and/or optimized.

Figure 9:
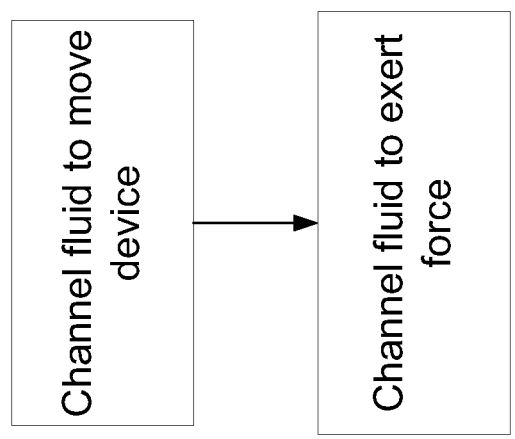
FIG. 9 is a schematic illustration of a method, according to an example.

FIG. 9 is a schematic illustration of a method, according to an example

The method to align and/or register a substrate 110 on a surface via a nozzled device, e.g., nozzle 140 may include channeling a fluid into the device to vertically move the nozzled device a distance via a first intake, as depicted in box 500 and/or channeling a fluid into the device via a second intake to exert a force, e.g., a calibrated force, as described above. The movement of the nozzled device and or the exerted force configured to facilitate the alignment and/or registration of the substrate, as depicted in box 510. In some examples the device may not need to move a distance to align and/or register the substrate.

In some examples the order of 500 and 510 may be reversed.

Examples may include apparatuses for performing the operations described herein. Such apparatuses may be specially constructed for the desired purposes, or may comprise computers or processors selectively activated or reconfigured by a computer program stored in the computers. Such computer programs may be stored in a computer-readable or processor-readable non-transitory storage medium, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions. It will be appreciated that a variety of programming languages may be used to implement the teachings of the examples as described herein. Examples may include an article such as a non-transitory computer or processor readable non-transitory storage medium, such as for example, a memory, a disk drive, or a USB flash memory encoding, including or storing instructions, e.g., computer-executable instructions, which when executed by a processor or controller, cause the processor or controller to carry out methods disclosed herein. The instructions may cause the processor or controller to execute processes that carry out methods disclosed herein.

Different examples are disclosed herein. Features of certain examples may be combined with features of other examples; thus, certain examples may be combinations of features of multiple examples. The foregoing description of the examples has been presented for the purposes of illustration and description. It is not intended to be exhaustive or to be limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the examples.

What is claimed is:

1. A nozzled device to align a substrate on a surface, the device comprising:
   a first intake and a second intake;
   the first intake configured to accept a first fluid;
   the second intake configured to accept a second fluid;
   the first fluid channeled into the device to vertically move the nozzled device a distance; and,
   the second fluid calibrated and channeled into the nozzled device, the nozzled device having a focusing outlet, the fluids configured to exert a force to facilitate the alignment of the substrate on the surface.

2. The nozzled device of claim 1, wherein the first intake is configured to accept air pressure to vertically move the device.

3. The nozzled device of claim 1, wherein the second intake is configured to accept air pressure to exert a force to align the substrate on the surface.

4. The nozzled device of claim 1, wherein the device is calibrated to vertically move a distance depending on the substrate.

5. The nozzled device of claim 1, wherein the device is configured to exert a calibrated force to align the substrate, the calibrated force depending on the substrate.

6. The nozzled device of claim 1, wherein the device is configured to exert a calibrated force to align the substrate against a roller.

7. The nozzled device of claim 1, wherein the device is configured to exert a calibrated force to align the substrate against strips applied to a roller.

8. A method to align a substrate on a surface via the nozzled device of claim 1, the method comprising:
   channeling a fluid into the device to vertically move the device a distance via the first intake and channeling a fluid into the device via the second intake to exert a force, the force configured to facilitate the alignment of the substrate on the surface.

9. The method of claim 8, wherein the first intake is configured to accept air pressure to vertically move the device.

10. The method of claim 8, wherein the second intake is configured to accept air pressure to exert a force to align the substrate on the surface.

11. The method of claim 8, wherein the device is calibrated to vertically move a distance, the distance depending on the substrate.

12. The method of claim 8, wherein the device is configured to exert a calibrated force to align the substrate, the calibrated force depending on the substrate.

13. The method of claim 8, wherein the device is configured to exert a calibrated force to align the substrate against a roller.

14. The method of claim 8, wherein the device is configured to exert a calibrated force to align the substrate against strips applied to a roller.

15. A system configured to align a substrate on a surface via a nozzled device, the system comprising:
   a first intake and a second intake;
   the first intake configured to accept a first fluid;
   the second intake configured to accept a second fluid;
   the first fluid channeled into the device to vertically move the device a distance; and,
   the second fluid calibrated and channeled into the nozzled device, the nozzled device having a focusing outlet, the fluids configured to exert a force to facilitate the alignment of the substrate on the surface;
   wherein the device is configured to exert a calibrated force to align the substrate against strips applied to a roller.

16. The system of claim 15, wherein the first intake is configured to accept air pressure to vertically move the device.

17. The system of claim 15, wherein the second intake is configured to accept air pressure to exert a force to align the substrate on the surface.

18. The system of claim 15, wherein the device is calibrated to vertically move a distance depending on the substrate.

19. The system of claim 15, wherein the device is configured to exert a calibrated force to align the substrate, the calibrated force depending on the substrate.

20. A nozzled device to align a substrate on a surface, the device comprising:
   a first intake and a second intake;
   the first intake configured to accept a first fluid;
   the second intake configured to accept a second fluid;
   the first fluid channeled into the device to vertically move the nozzled device a distance; and,
   the second fluid calibrated and channeled into the nozzled device, the nozzled device having a focusing outlet, the fluids configured to exert a force to facilitate the alignment of the substrate on the surface;
   wherein the device is configured to exert a calibrated force to align the substrate against a roller.

* * * * *

UNITED STATES PATENT AND TRADEMARK OFFICE
CERTIFICATE OF CORRECTION

PATENT NO. : 8,919,528 B2  
APPLICATION NO. : 13/548525  
DATED : December 30, 2014  
INVENTOR(S) : Yuval Dim et al.

Page 1 of 1

It is certified that error appears in the above-identified patent and that said Letters Patent is hereby corrected as shown below:

ON THE TITLE PAGE

Item (75), Inventors, in column 1, line 3, delete "Gan Yeoshaya" and insert -- Gan Yoshiya --, therefor.

Signed and Sealed this
Tenth Day of May, 2016

Michelle K. Lee
*Director of the United States Patent and Trademark Office*